US008031651B2

(12) United States Patent
Rofougaran

(10) Patent No.: US 8,031,651 B2
(45) Date of Patent: *Oct. 4, 2011

(54) METHOD AND SYSTEM FOR MINIMIZING POWER CONSUMPTION IN A COMMUNICATION SYSTEM

(75) Inventor: Ahmadreza Rofougaran, Newport Coast, CA (US)

(73) Assignee: Broadcom Corporation

( * ) Notice: Subject to any disclaimer, the term of this patent is extended or adjusted under 35 U.S.C. 154(b) by 1220 days.

This patent is subject to a terminal disclaimer.

(21) Appl. No.: 11/536,657

(22) Filed: Sep. 29, 2006

(65) Prior Publication Data

US 2008/0080549 A1 Apr. 3, 2008

(51) Int. Cl.
*H04W 4/00* (2009.01)
(52) U.S. Cl. ........ 370/321; 370/347; 375/316; 375/216; 455/450; 455/555
(58) Field of Classification Search .............. 370/321, 370/329, 350, 509, 310.1, 314, 344, 347; 455/127.1, 316, 552.1–553.1, 450, 555; 375/316, 375/216
See application file for complete search history.

(56) References Cited

U.S. PATENT DOCUMENTS

| | | | | |
|---|---|---|---|---|
| 5,423,078 | A * | 6/1995 | Epperson et al. | 455/553.1 |
| 5,426,641 | A * | 6/1995 | Afrashteh et al. | 370/347 |
| 5,732,334 | A * | 3/1998 | Miyake | 455/126 |
| 5,878,332 | A * | 3/1999 | Wang et al. | 455/84 |
| 6,112,062 | A * | 8/2000 | Hans et al. | 455/114.3 |
| 7,088,299 | B2 * | 8/2006 | Siegler et al. | 343/745 |
| 7,245,882 | B1 * | 7/2007 | McFarland | 455/73 |
| 2001/0031621 | A1 * | 10/2001 | Schmutz | 455/7 |
| 2002/0015423 | A1 * | 2/2002 | Rakib et al. | 370/485 |
| 2002/0109635 | A1 * | 8/2002 | Geeraert | 343/702 |
| 2003/0109240 | A1 * | 6/2003 | Zipper | 455/323 |
| 2003/0219035 | A1 * | 11/2003 | Schmidt | 370/478 |
| 2004/0136473 | A1 * | 7/2004 | Yang et al. | 375/322 |
| 2004/0208157 | A1 * | 10/2004 | Sander et al. | 370/345 |
| 2005/0020299 | A1 * | 1/2005 | Malone et al. | 455/552.1 |

(Continued)

FOREIGN PATENT DOCUMENTS

KR 20010078104 8/2001

(Continued)

OTHER PUBLICATIONS

European Search Report corresponding to European Patent Application No. 07007616.1-2215, dated May 19, 2009.

*Primary Examiner* — Pierre-Louis Desir
(74) *Attorney, Agent, or Firm* — McAndrews, Held & Malloy, Ltd.

(57) ABSTRACT

Certain embodiments of the invention may be found in a method and system for minimizing power consumption in a communication system. Exemplary aspects of the invention may comprise configuring a supply voltage of an amplifier to enable communication of data using a first communication protocol during a first timeslot in a TDM frame, reconfiguring the supply voltage of the amplifier to enable communication of data using a different communication protocol, and adjusting the supply voltage of the amplifier in proportion to the envelope of a baseband signal conforming to one of the communication protocols. The first and second communication protocols may conform to various communication protocols, such as WCDMA, HSDPA, HSUDPA, GSM, GPRS, EDGE, WiMAX, OFDM, UWB, ZigBee, and Bluetooth. The baseband signal may be delayed by a number of samples before being input into the amplifier.

30 Claims, 10 Drawing Sheets

U.S. PATENT DOCUMENTS

| | | | |
|---|---|---|---|
| 2005/0128978 A1* | 6/2005 | Pecen et al. | 370/329 |
| 2005/0135502 A1* | 6/2005 | Zhang et al. | 375/297 |
| 2005/0186933 A1* | 8/2005 | Trans | 455/296 |
| 2005/0266811 A1 | 12/2005 | Weiss | |
| 2006/0114836 A1* | 6/2006 | Pollin et al. | 370/252 |
| 2006/0202892 A1* | 9/2006 | Feng et al. | 342/374 |
| 2007/0001810 A1* | 1/2007 | Scott et al. | 340/10.1 |
| 2007/0001813 A1* | 1/2007 | Maguire et al. | 340/10.2 |
| 2007/0025471 A1* | 2/2007 | Chen et al. | 375/316 |
| 2007/0060071 A1* | 3/2007 | Rafi et al. | 455/76 |
| 2007/0155344 A1* | 7/2007 | Wiessner et al. | 455/78 |
| 2007/0173202 A1* | 7/2007 | Binder et al. | 455/68 |
| 2007/0184778 A1* | 8/2007 | Mechaley | 455/12.1 |
| 2007/0238483 A1* | 10/2007 | Boireau et al. | 455/553.1 |
| 2007/0259628 A1* | 11/2007 | Carmel et al. | 455/127.1 |
| 2008/0007333 A1* | 1/2008 | Lee et al. | 330/136 |

FOREIGN PATENT DOCUMENTS

| | | |
|---|---|---|
| KR | 20030006051 | 1/2003 |
| WO | WO 2006/029082 | 3/2006 |

* cited by examiner

METHOD AND SYSTEM FOR MINIMIZING POWER CONSUMPTION IN A COMMUNICATION SYSTEM

CROSS-REFERENCE TO RELATED APPLICATIONS/INCORPORATION BY REFERENCE

This application makes reference to:

U.S. application Ser. No. 11/536,678, filed on even date herewith;
U.S. application Ser. No. 11/536,682, filed on even date herewith;
U.S. application Ser. No. 11/536,650, filed on even date herewith;
U.S. application Ser. No. 11/536,644, filed on even date herewith;
U.S. application Ser. No. 11/536,676, filed on even date herewith;
U.S. application Ser. No. 11/536,659, filed on even date herewith;
U.S. application Ser. No. 11/536,673, filed on even date herewith;
U.S. application Ser. No. 11/536,679, filed on even date herewith;
U.S. application Ser. No. 11/536,670, filed on even date herewith;
U.S. application Ser. No. 11/536,672, filed on even date herewith;
U.S. application Ser. No. 11/536,648, filed on even date herewith;
U.S. application Ser. No. 11/536,669, filed on even date herewith;
U.S. application Ser. No. 11/536,666, filed on even date herewith;
U.S. application Ser. No. 11/536,675, filed on even date herewith;
U.S. application Ser. No. 11/536,685, filed on even date herewith;
U.S. application Ser. No. 11/536,645, filed on even date herewith;
U.S. application Ser. No. 11/536,655, filed on even date herewith;
U.S. application Ser. No. 11/536,660, filed on even date herewith;
U.S. application Ser. No. 11/536,662, filed on even date herewith;
U.S. application Ser. No. 11/536,688, filed on even date herewith;
U.S. application Ser. No. 11/536,667, filed on even date herewith;
U.S. application Ser. No. 11/536,651, filed on even date herewith;
U.S. application Ser. No. 11/536,656, filed on even date herewith; and
U.S. application Ser. No. 11/536,663, filed on even date herewith.

The above stated applications are hereby incorporated herein by reference in their entirety.

FIELD OF THE INVENTION

Certain embodiments of the invention relate to communication systems. More specifically, certain embodiments of the invention relate to a method and system for minimizing power consumption in a communication system.

BACKGROUND OF THE INVENTION

Mobile communications has changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the data connections, such as the mobile Internet, for example, is the next step in the mobile communication revolution. The mobile Internet is poised to become a common source of everyday information, and easy, versatile mobile access to this data will be taken for granted.

Third generation (3G) cellular networks have been specifically designed to fulfill these future demands of the mobile Internet. As these services grow in popularity and usage, factors such as cost efficient optimization of network capacity and quality of service (QoS) will become even more essential to cellular operators than it is today. These factors may be achieved with careful network planning and operation, improvements in transmission methods, and advances in receiver techniques. To this end, carriers need technologies that will allow them to increase downlink throughput and, in turn, offer advanced QoS capabilities and speeds that rival those delivered by cable modem and/or DSL service providers. In this regard, networks based on wideband CDMA (WCDMA) technology may make the delivery of data to end users a more feasible option for today's wireless carriers.

The evolution of WCDMA technology has resulted in the development of various wireless communication technologies, including General Packet Radio Service (GPRS), Enhanced Data rates for GSM (Global System for Mobile communications) Evolution (EDGE), Universal Mobile Telecommunications System (UMTS), and High Speed Downlink Packet Access (HSDPA), for example. In this regard, the GPRS and EDGE technologies may be utilized for enhancing the data throughput of present second generation (2G) systems such as GSM. The UMTS wireless communication technology is an adaptation of the WCDMA 3G system by GSM. The HSDPA wireless communication technology is an Internet protocol (IP) based service, oriented for data communications, which adapts WCDMA to support data transfer rates on the order of 10 megabits per second (Mbits/s).

Battery life in mobile devices, such as cellular telephones, has always been an important consideration for consumers. For some consumers, battery life issues may be mitigated by using higher capacity batteries. But with higher capacity usually comes increased weight and size, which are important consideration for other consumers. One way in which designers have tackled this dilemma has been to optimize battery usage. For example, many cellular protocols facilitate a discontinuous RX and TX so that the receiver and transmitter portions of the cellular telephone are disabled when not in use. In addition, the processors in such devices may shut down other modules and may even disable various system clocks when they are not needed. For instance, USB controllers, SIM controllers and the like may be disabled when they are not needed and the CPU clock may be shutdown as well.

Although these techniques have increased battery life, the need for smaller and smaller mobile devices and therefore smaller and smaller batteries has persisted. Therefore, additional techniques are required to extend battery life even further.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for minimizing power consumption in a communication system, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for minimizing power consumption in a communication system. Exemplary aspects of the invention may comprise configuring a supply voltage of an amplifier to enable communication of data using a first communication protocol during a first timeslot in a TDM frame, reconfiguring the supply voltage of the amplifier to enable communication of data using a different communication protocol, and adjusting the supply voltage of the amplifier in proportion to the envelope of a baseband signal conforming to one of the communication protocols. The first and second communication protocols may conform to various communication protocols, such as WCDMA, HSDPA, HSUDPA, GSM, GPRS, EDGE, WiMAX, OFDM, UWB, ZigBee, and Bluetooth. The baseband signal may be delayed by a number of samples before being input into the amplifier. The number of samples may be calculated by minimizing the amount of intermodulation distortion at the output of the amplifier. The supply voltage may be generated by a switching regulator. The method may also include configure a bias voltage of the amplifier to enable communication over the various protocols as well as adjusting the bias voltage of the amplifier in proportion to the envelope of the baseband signal, where the bias voltage may control the gain of the amplifier. The bias voltage may also be generated by a switching regulator.

Figure 1:
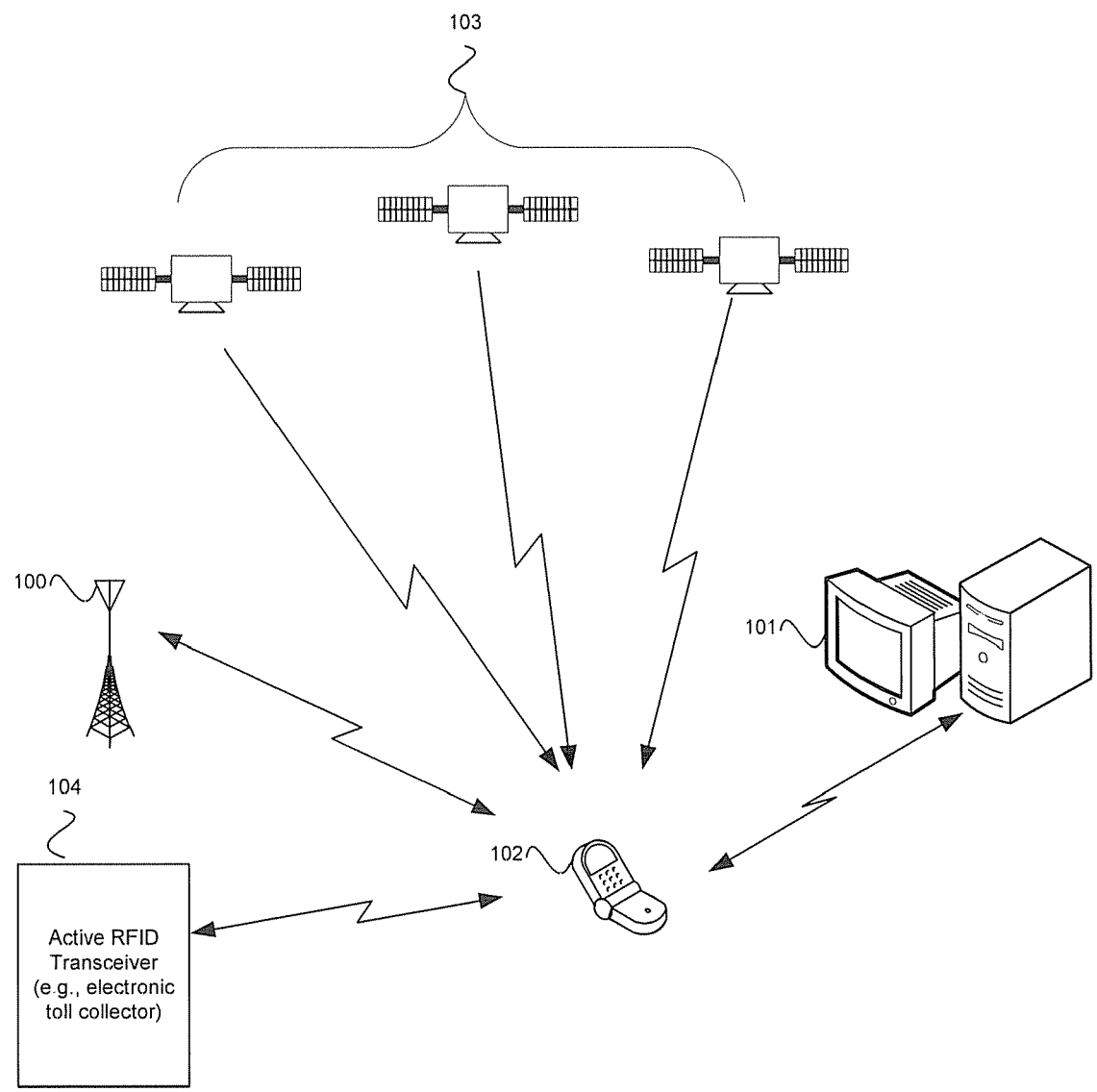
FIG. 1 is a block diagram of an exemplary mobile device communicating with a plurality of wireless systems, in accordance with an embodiment of the invention.

FIG. 1 is a block diagram of an exemplary mobile device communicating with a plurality of wireless systems, in accordance with an embodiment of the invention. Referring to FIG. 1, there is shown an RFID transceiver 104, a cellular telephone tower 100, a satellite communication system 103, a computer 101, and a mobile device 102. The RFID transceiver 104 may comprise suitable logic, circuitry, and/or code that may enable near field communication (NFC) with a mobile device. For example, the RFID transceiver 104 may be implemented as part of an electronic toll collection application in which the RFID transceiver 104 may be located at a toll plaza. In this regard, a mobile device 102 that support NFC may, for example, be used to authorize toll payments.

The cellular telephone tower 100 may comprise suitable logic, circuitry, and or code that may enable transmitting information to and receiving information from a mobile device 102. In this regard, the cellular telephone tower 100 may transmit and receive information utilizing a TDMA communication protocol, such as GSM. In this regard, information may be communicated to the mobile device 102 during timeslots. For example, one timeslot may be used to receive information from the mobile device 102 and the other may be used to transmit information to the mobile device 102. Other timeslots may be used to communicate with other mobile devices.

The satellite communication system 103 may comprise suitable logic, circuitry, and/or code that may enable a mobile device to determine its location on earth. For example, the satellite communication system 103 may be comprised of a plurality of satellites all working in concert so that a mobile device 102 may triangulate its position. In this regard, the satellite communication system 103 may be a global positioning satellite (GPS) system.

The computer 101 may comprise suitable logic, circuitry, and or code that may enable communicating data utilizing a variety of communication protocols. For example, the computer 101 may communicate data utilizing a WLAN protocol, such as 802.11, or a Bluetooth protocol. In this regard, the computer 101 may utilize these protocols to communicate to a mobile device 102. For example, the computer 101 may discover and make itself accessible to the mobile device 102. The mobile device 102 may then initiate a data transfer to the computer 101. For example, the mobile device 102 may transfer information stored in a subscriber identity module (SIM), such as an address book, to the computer utilizing one of the protocols.

The mobile device 102 may comprise suitable logic, circuitry, and/or code that may enable receiving and transmitting information utilizing a plurality of communication protocols. For example, the mobile device 102 may utilize a time division multiple access (TDMA) protocol, such as GSM, for handling voice and data calls. In this regard, the mobile device 102 may utilize two timeslots within a GSM frame to communicate voice data to a cellular telephone tower 100. The mobile device 102 may communicate to other devices utilizing other communication protocols during unused timeslots. For example, the mobile device 102 may communicate to a computer 101 utilizing a Bluetooth protocol. The mobile device 102 may also receive information, such as GPS satellite information during other timeslots as well. The mobile device 102 may also be enabled to receive NFC signals from an RFID transceiver 104.

Utilizing unused timeslots to communicate information may enable resources within the mobile device 102 to be used more efficiently. For example, a PLL may be configured to enable GSM RX operation during a first timeslot. During other timeslots where GSM operation may not be required, the PLL may be reconfigured to support other communication protocols, such as Bluetooth. Therefore, only one PLL may be necessary to support the two protocols.

Figure 2:
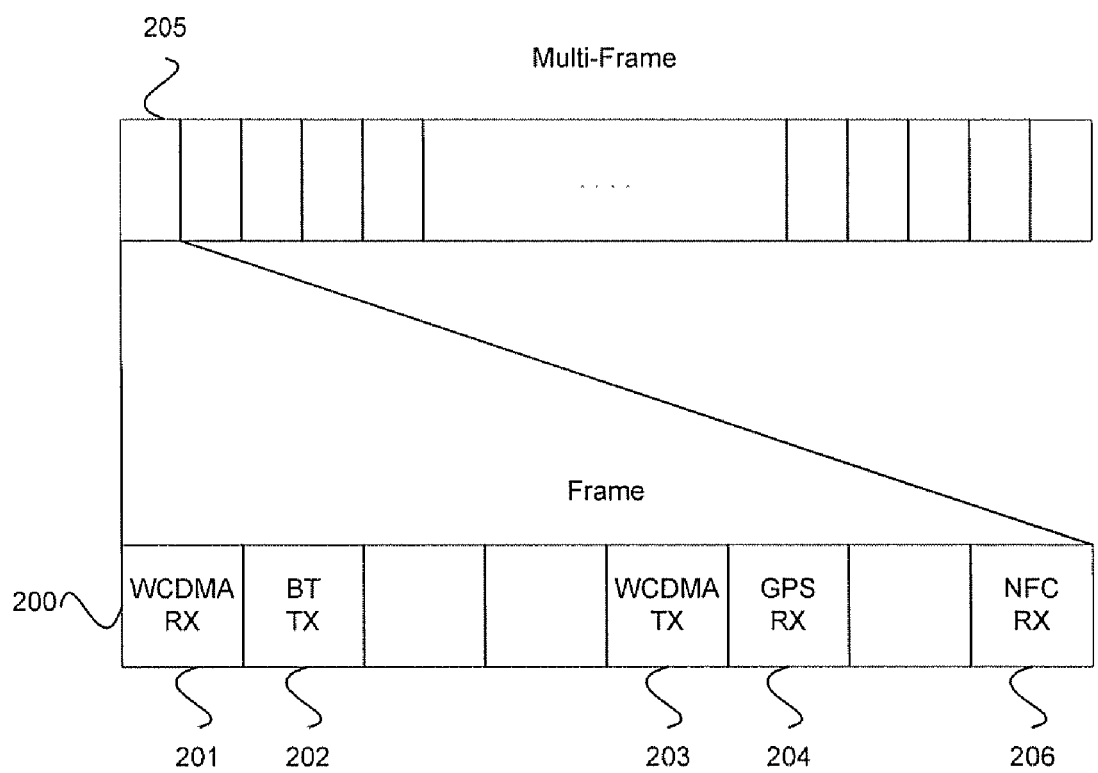
FIG. 2 is a block diagram of an exemplary time slot arrangement, in accordance with an embodiment of the invention.

FIG. 2 is a block diagram of an exemplary time slot arrangement, in accordance with an embodiment of the invention. Referring to FIG. 2, there is shown a multi-frame 205, a single frame 200, a WCDMA RX timeslot 201, a WCDMA TX timeslot 203, a Bluetooth TX timeslot 202, a GPS RX timeslot 204, and a NFC RX timeslot 206. The multi-frame 205 may conform to a WCDMA standard described above. In this regard, the multi-frame 205 may comprise 26 frames, where the length of each frame may be 4.16 milliseconds. Some of the frames within the multi-frame may be used to communicate data to a mobile device 102 (FIG. 1).

The single frame 200 may be one of a plurality of frames in the multi-frame 205. The single frame 200 may be divided into, for example, eight (8) timeslots. A mobile device 102 may communicate utilizing a plurality of communication protocols within the single frame 200. For example, the mobile device 102 may receive information from a cellular telephone tower 100 (FIG. 1) during the WCDMA RX timeslot 201 and may transmit information to a cellular telephone tower 100 during the WCDMA TX timeslot 203. During other timeslots, the mobile device 102 may be configured to communicate using other communication protocols. For example, the mobile device 102 may be configured to communicate to a computer using, for example a Bluetooth transmission system during the Bluetooth TX slot 202. The mobile terminal may also be configured to receive signals from a plurality of satellites during the GPS RX time slot 204. The mobile terminal may also be configured to receive signals from a radio broadcast station during the NFC RX time slot 206.

Figure 3:
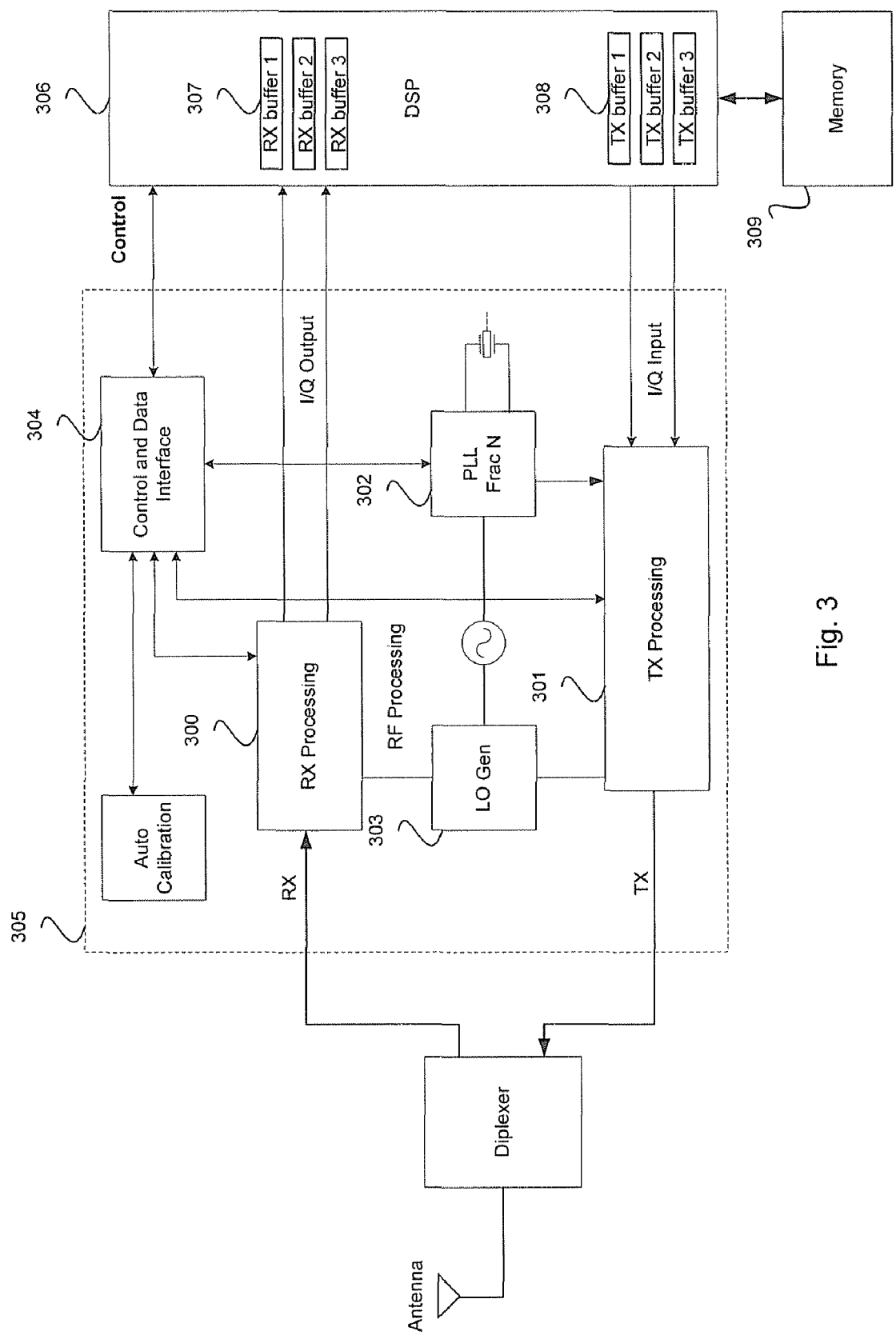
FIG. 3 is a block diagram of an exemplary system for sharing components in a time division multiplex wireless system, in accordance with an embodiment of the invention.

FIG. 3 is a block diagram of an exemplary system for sharing components in a time division multiplex wireless system, in accordance with an embodiment of the invention. Referring to FIG. 3, there is shown a software definable radio (SDR) 305, a DSP 306, and a non-volatile memory 309. The SDR 305 may comprise a RX processing system 300, a TX processing system 301, a PLL 302, an oscillator 303, and a control block 304. The DSP 306 may comprise receive buffers 307 and transmit buffers 308.

The RX processing system 300 may comprise suitable logic, code, and/or circuitry that may enable receiving RF signals corresponding to a plurality of communication protocols. For example, the RX processing system 300 may be adapted to receive WCDMA transmissions, such as UMTS or IS-95. The RX processing system 300 may be further adapted to receive other forms of transmissions, for example, Bluetooth, WLAN, GPS, NFC, WLAN, ZigBee, and DVB-H. In this regard, the RX processing system 300 may comprise a plurality of filters, which may be tailored so that the selected transmission may be properly received. For example, the RX processing system 300 may include a band pass filter that may in one instance be centered around a carrier frequency associated with, for example, a cellular telephone tower 100 (FIG. 1), and in another instance may be centered around a carrier frequency associated with a Bluetooth signal from a computer 101 (FIG. 1). In this regard, the RX processing system 300 may be capable of receiving RF signals corresponding to one communication protocol in one timeslot and another communication protocol in another timeslot within the same frame. The RX processing system 300 may convert the received signals into an I and Q representation for subsequent processing by, for example, a DSP.

The TX processing system 301 may comprise suitable logic, code, and/or circuitry that may enable transmitting signals corresponding to a plurality of communication protocols. For example, the TX processing system 301 may be adapted to receive I and Q representations of data to be communicated using a particular communication protocol, such as UMTS or IS-95. The TX processing system 301 may be further adapted to transmit other forms of transmissions, for example, Bluetooth, WLAN, GPS, NFC, WLAN, ZigBee, and DVB-H. In this regard, the TX processing system 301 may comprise a plurality of filters and an RF power amplifier that may be configured so that the data may be transmitted utilizing the proper communication protocol. For example, the TX processing system 301 may include a band pass filter that may in one instance be center around a carrier frequency associated with, for example, a cellular telephone tower 100, and in another instance may be centered around a carrier frequency associated with a Bluetooth signal from a computer 101. In this regard, the TX processing system 301 may be capable of transmitting RF signals corresponding to one communication protocol in one timeslot and another communication protocol in another timeslot within the same frame.

The TX processing system 301 may also comprise a plurality of amplifiers and mixers. For example, the TX processing system 301 may comprise a power amplifier (PA) for amplifying low level RF signals so that they may be transmitted via an antenna. Mixers may be utilized for modulating I/Q signals from the DSP 306. Additionally, the TX processing system 301 may comprise drivers that may be utilized to match the input impedance of the PA. The various amplifiers, mixers, and drivers may comprise linear amplifiers.

The oscillator 303 may comprise suitable logic, circuitry, and/or code that may enable generation of a local oscillator signal with a particular frequency. The local oscillator signal from the oscillator 303 may be input the RX processing system 300, the TX processing system 301 and the PLL 302. For example, the local oscillator signal may be used as the reference for a quadrature phase demodulator that may reside within the RX processing system 300. In this regard, the demodulator may shift the carrier frequency of a received RX signal down to a baseband carrier frequency so that the RX signal may be converted into an I and Q domain.

The PLL 302 may comprise suitable logic, circuitry and/or code that may enable generating an output frequency that may be a multiple of an input frequency. For example, the PLL 302 may be a fractional N synthesizer. In this regard, the PLL may effectively generate an output signal that may have a frequency that may be a non-integer multiple of the frequency of an input signal, such as the output of the oscillator 303. For example, if the oscillator 303 frequency is 1 MHz, the output of the PLL may be $$1 \text{Mhz} * \frac{M}{N}$$

where M and N may be integers. In this way, the PLL may be configured to output a plurality of frequencies that may enable communicating information utilizing a plurality of communication protocols.

The control block 304 may comprise suitable logic, circuitry, and/or code that may enable configuration of a plurality of components within a SDR. For example, the control block 304 may comprise a plurality of registers. The registers may in turn be used to control the functionality of the various components that make up the SDR 305. In this regard, the control block 304 may be interfaced to a data bus connected to the DSP 304 so that the DSP 304 may read and write to registers within the control block 304. The control block 304 may also control which of a plurality of communication protocols may be used at any given time. For example, the control block 304 may comprise a timer for triggering events. The events may be used to reconfigure the various components of the SDR 305 at specific time. In an exemplary embodiment of the invention, a first event may be used to configure the SDR 305 so that a first timeslot may be used as WCDMA TX timeslot 203 (FIG. 2). A subsequent event may reconfigure the SDR 305 so that a second timeslot may be used, for example, as a Bluetooth TX timeslot 202 (FIG. 2). Having the controller perform this function may reduce the processing power requirements of the DSP 304.

The DSP 304 may comprise suitable logic, circuitry and/or code that may enable may enable sending and receiving I and Q data to and from the SDR 305 as well as suitable logic, circuitry and/or code that may enable configuring the SDR 305. In this regard, the DSP 304 may convert data from various sources into I and Q information and visa versa. The DSP 304 may maintain information to be transmitted in a buffer until the SDR 305 may be ready to send the information. In this regard, the DSP 304 may comprise a plurality of transmit and receive buffers 308 and 307 corresponding to a plurality of communication protocols, such as WCDMA and Bluetooth. The non-volatile memory 309 may comprise suitable logic, circuitry, and/or code that may enable storing data. In this regard, the DSP 304 may store various configuration settings within the non-volatile 611 so that the SDR 305 may be re-initialized after a system reset.

An event from the Control block may be communicated to the DSP 304 that may indicate to the DSP 304 which type of I and Q data to send or receive. For example, the control block may communicate an event to the DSP 304 indicating that the next time slot in, for example, a WCDMA frame may be used to transmit Bluetooth data. In this case, the DSP 304 may switch to a buffer 308 corresponding to Bluetooth data and begin communicating I and Q samples corresponding to Bluetooth data to the SDR 305 after the event occurs. The control block may then communicate to the DSP 304 that the next slot may, for example, be utilized to communicate WCDMA TX information. The DSP may then switch over to a buffer 308 corresponding to WCDMA TX data and output I and Q samples corresponding to that data to the SDR 305.

Figure 4:
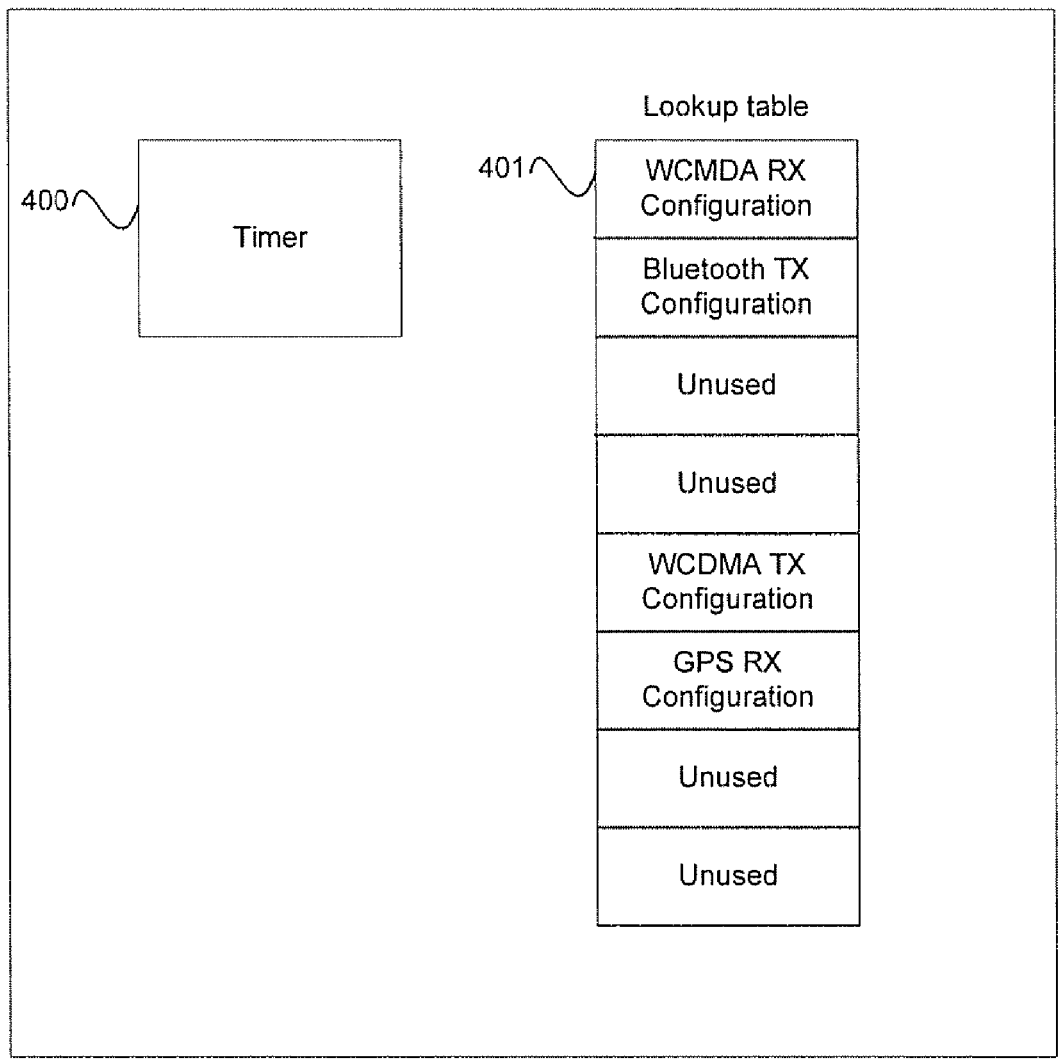
FIG. 4 is a block diagram of an exemplary control and data interface, in accordance with an embodiment of the invention.

FIG. 4 is a block diagram of an exemplary control and data interface, in accordance with an embodiment of the invention. Referring to FIG. 4, there is shown a timer 400 and a lookup table 401. The timer may comprise suitable logic, circuitry, and/or code that may enable generation of periodic events. In this regard, the periodicity of the timer and when events occur may be configured by a processor, such as a DSP 306. The lookup table 401 may comprise suitable logic, circuitry, and/or code that may enable storing various hardware configuration settings corresponding to specific timeslots. For example, the first element in the lookup table 401 may comprise hardware configuration settings to be utilized during a first time slot in a TDMA frame. The subsequent elements may correspond to other timeslots within the same TDMA frame.

In operation, a DSP 306 (FIG. 3) may configure the timer, for example, to generate 8 timeslot event over a period of, for example, 4.16 milliseconds. In addition, a DSP may program the lookup table 401 with configuration settings for a plurality of hardware components. The configuration settings may be settings that enable the hardware components within the SDR 305 (FIG. 3) to process specific communication protocols. For example, the second element in the lookup table may comprise configuration settings that may enable Bluetooth transmission. The fifth element in the lookup table may comprise configuration settings that may enable WCDMA transmission. In operation, the timer may output the configuration settings stored in the lookup time for every timeslot. For example, during a second timeslot the Bluetooth transmission configuration settings may be output. During the fifth timeslot the WCDMA transmission configuration settings may be output. In this manner, the control block may autonomously reconfigure the various hardware components, such as the RX processing system 300 (FIG. 3), the TX processing system 301 (FIG. 3), the PLL 302 (FIG. 3), and the oscillator 303 (FIG. 3). Reconfiguring the components for use with the various communication protocols may reduce the cost of the system because fewer components may be needed. This may result in a reduction in the board area required in a mobile device 102 (FIG. 1). Additionally, power consumption may be reduced because the components may not be spending as much time in an idle mode.

Figure 5A:
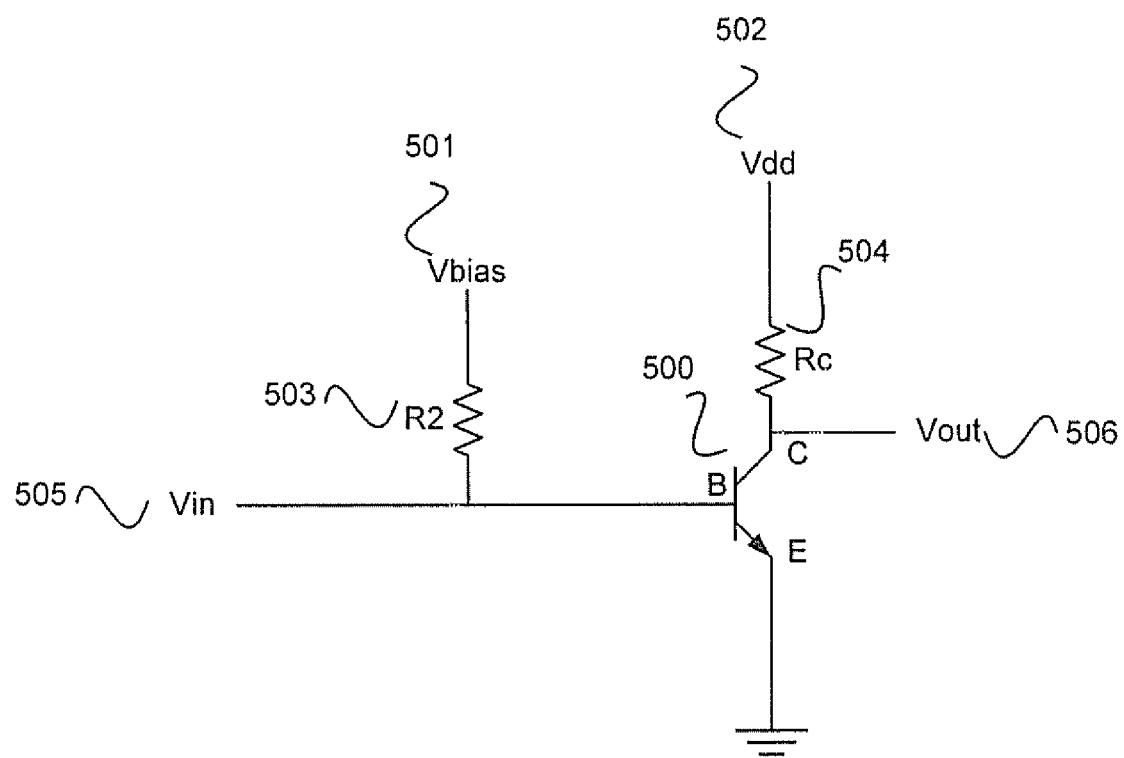
FIG. 5A is a block diagram of an exemplary linear amplifier, which may be utilized in connection with an embodiment of the invention.

FIG. 5A is a block diagram of an exemplary linear amplifier, which may be utilized in connection with an embodiment of the invention. Referring to FIG. 5A, there is shown a transistor 500, a collector resistor (Rc) 504, a bias resistor 503, a bias input voltage 501, a collector voltage 502, an input signal 505, and an output signal 506.

In operation, the collector of the transistor 500 may be connected to a supply voltage 502, via a collector resistor (Rc). A bias voltage 501 may also be provided for controlling the voltage on the collector of the transistor 500. The bias voltage may then be modulated by an input signal 505 and 511. The output signal 510 may be an amplified version of the input signal.

The bias voltage 501 may be chosen so as to maximize the amount of voltage swing available for the output signal 510. For example, the bias voltage 501 may be chosen so that the collector voltage on the transistor 500 is, for example, 50% of the supply voltage 502. This may enable the greatest peak-to-peak voltage swing in the output signal 510. The bias voltage may also control the gain of the transistor.

Figure 5B:
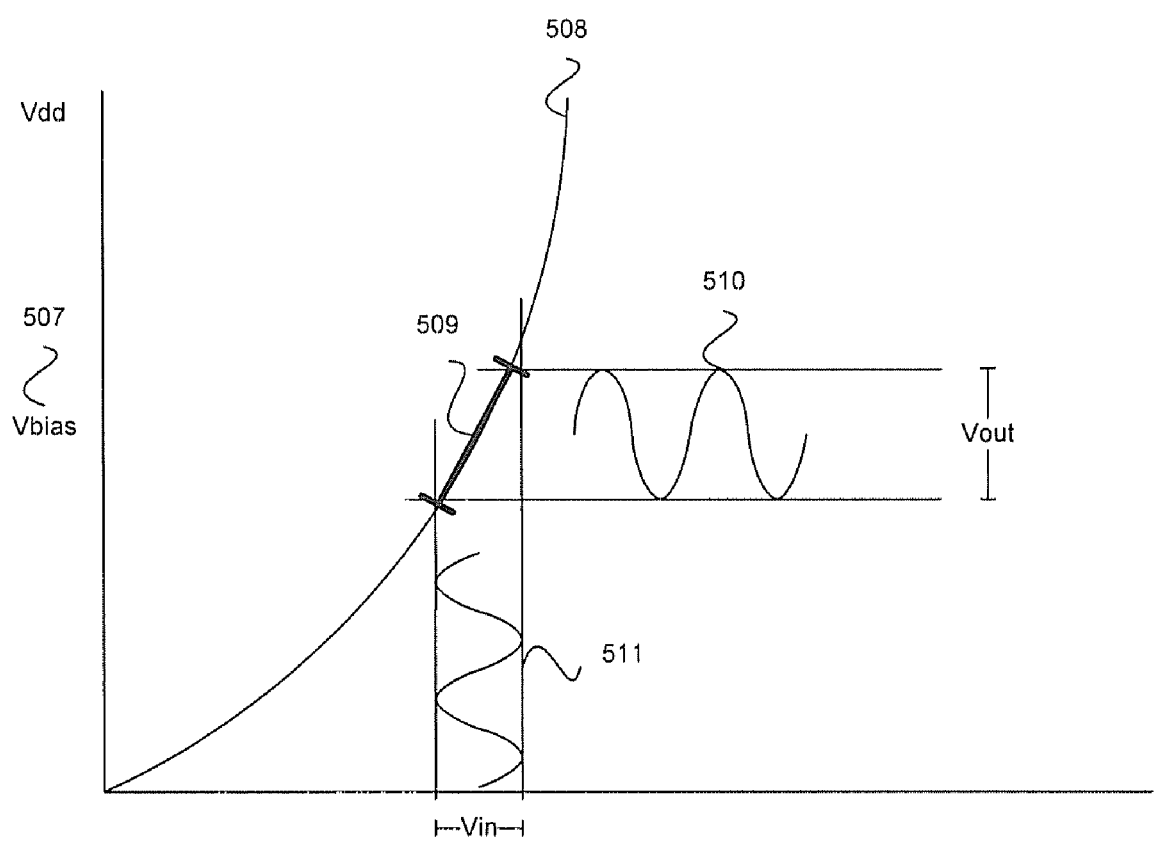
FIG. 5B is a diagram of an exemplary input/output relationship of a linear amplifier, which may be utilized in connection with an embodiment of the invention.

FIG. 5B is a diagram of exemplary input/output characteristics of a linear amplifier, which may be utilized in connection with an embodiment of the invention. Referring to FIG. 5B, there is shown a transconductance curve 508, an active region 509, an input signal 511, and an output signal 510. The characteristics shown in FIG. 5B may correspond to the circuit shown in FIG. 5A Referring, to FIG. 5B, a lower bias voltage may result in a lower gain and conversely a higher bias voltage may result in a higher gain. In this regard, the gain of the transistor 500 may be non-linear when the variation of the output signal 510 may be large.

Most of the power dissipated in the circuit shown in FIG. 5A may be dissipated by the collector resistor 504 and the transistor 500. The power dissipated in the two components may be represented by following formulas:

$$P_{Rc} = \frac{(V_{dd} - V_c)^2}{R_C}$$

$$I_{Rc} = \frac{(V_{dd} - V_c)}{R_C}$$

$$P_Q = V_c \cdot I_{Rc}$$

$$P_{TOT} = P_{Rc} \cdot P_Q$$

where Vc is the collector voltage set by the bias voltage 501, $I_{RC}$ is the current passing through the collector resistor, $P_{RC}$ is the power dissipation in the collector resistor, $P_Q$ is the power dissipation in the transistor, and $P_{tot}$ is approximate power dissipation of the circuit. Thus, the total power dissipation in the circuit may be lowered by lowering the supply voltage. It may therefore be advantageous to limit the supply voltage to that amount needed to support a given output voltage swing in the output signal 510. In situations where a lower gain may be needed, the bias voltage may be chosen so as to move the output signal 510 down on the curve shown in FIG. 5B. This may allow for a further reduction in the supply voltage and therefore may further lower the overall power dissipation in the circuit.

Figure 6:
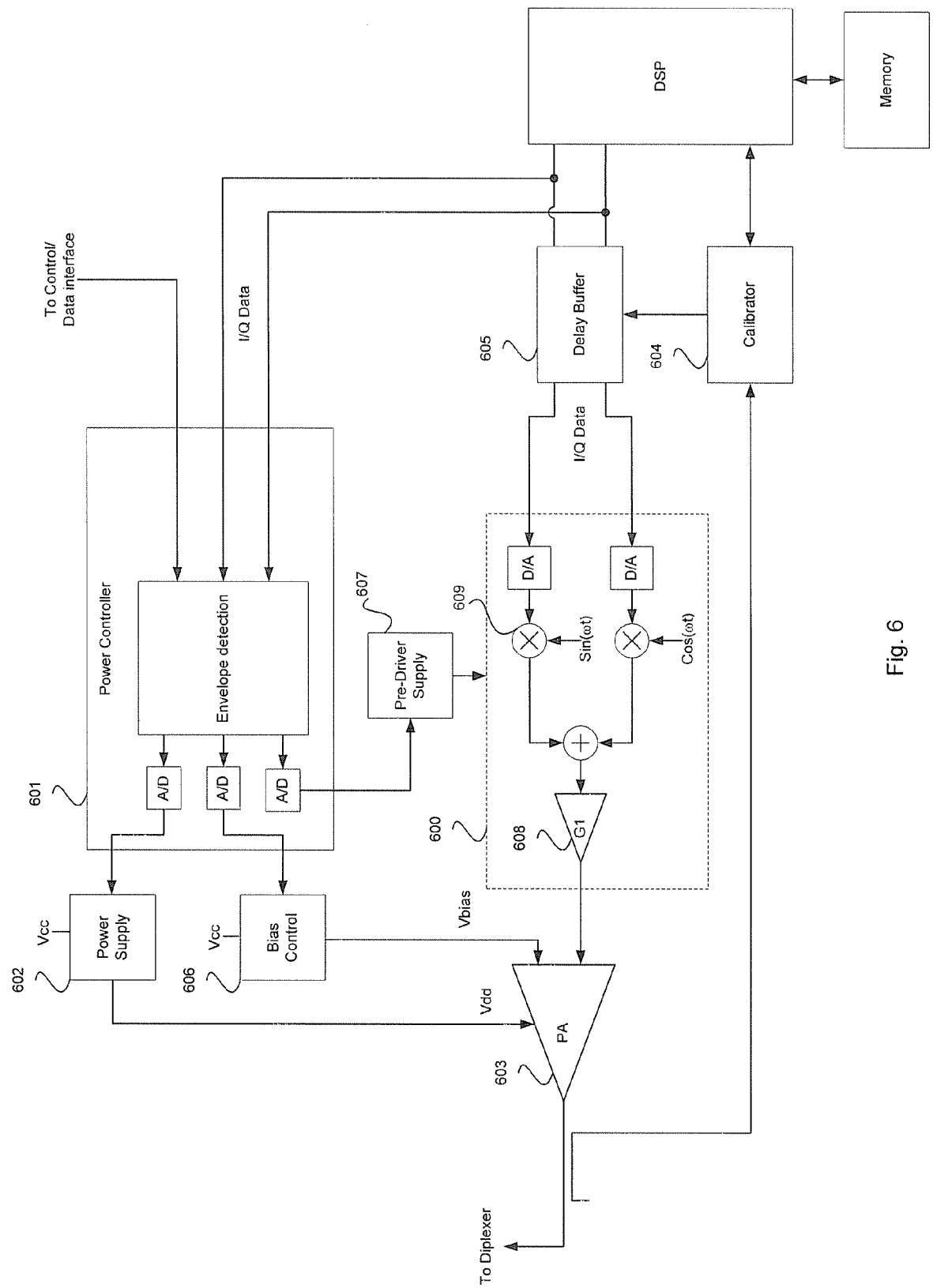
FIG. 6 is a block diagram of an exemplary TX processing system, in accordance with an embodiment of the invention.

FIG. 6 is a block diagram of an exemplary TX processing system, in accordance with an embodiment of the invention. Referring to FIG. 6, there is shown a power amplifier (PA) 604, a pre-driver 600, a delay buffer 606, a calibrator 605, a power controller 601, a power supply 603, a pre-driver power supply 608, and a bias controller 607. The pre-driver 600 may comprise a driver 609, and a pair of mixers 610. The PA 604 may comprise suitable logic, circuitry and or code that may enable amplifying an input signal so that it may be transmitted via an antenna. The internal structure of the PA may comprise the circuitry shown in FIG. 5A. In this regard, in addition to an input and output signal, the PA may also have supply voltage input and a bias voltage input.

The pre-driver 600 may comprise suitable logic, code, and/or circuitry that may enable RF modulation of a baseband signal. In this regard, the input signal may be an in-phase and quadrature phase (I/Q) representation of data to be transmitted. The I/Q data may originate from a DSP 602 and pass through a delay buffer 606 before being input into the pre-driver 600. The output of the pre-driver 600 may be then output an RF signal to the PA 604 where it may then be amplified and transmitted via an antenna.

The mixers 610 may comprise suitable logic, circuitry, and/or code that may enable up-converting an input signal. In this regard, the mixers 610 may effectively output the product of the incoming signal and a local oscillator. The output of the mixer may be represented by the following formula:

$$V_o = [A_1 \cos(\omega_1 t)][A_2 \cos(\omega_2 t)] = \frac{A_1 A_2}{2}[\cos(\omega_1 - \omega_2)t + \cos(\omega_1 + \omega_2)t]$$

where $V_o$ is the output of the mixer, $A_1$ and $A_2$ are the amplitudes of the respective inputs to the mixer 610, and $\omega_1$ and $\omega_2$ are the period of the respective input signals. The mixer 610 may effectively create replicas of the input signal at frequencies above and below the original signals frequency. In the case of an up-converter, a high-pass filter may be used to strip off the lower frequency signal leaving only the up-converted or RF modulated signal. To facilitate the conversion, various buffers may be utilized within the mixers 610. The internal structure of these buffers may comprise the circuitry shown in FIG. 5A. In this regard, in addition to an input and output signal, the buffers may also have a supply voltage input and may be biased to have a predetermined gain. The output of the mixers 610 may be added to together to create a composite output signal, which may then be input into a driver.

The driver 609 may comprise suitable logic, circuitry, and/ or code that may enable amplifying or buffering and RF signal. In this regard, the driver 609 may be utilized to match the input impedance of the PA 604. The driver 609 may have a gain greater than one, in which case the output signal may be greater than the input signal. The internal structure of the driver 609 may comprise the circuitry shown in FIG. 5A. In this regard, in addition to an input and output signal, the driver 609 may also have a supply voltage input and may be biased to have a predetermined gain.

The delay buffer 606 may comprise suitable logic, circuitry, and/or code that may enable delaying an input signal by a specified number of samples. In this regard, the delay buffer 606 may comprise a FIFO. For example, the FIFO may be sized to hold 10 I/Q samples. Thus, the samples leaving the delay buffer may be delayed by 10 samples. The I/Q samples may be communicated to the delay buffer by the DSP 602 and then passed on to the pre-driver 600.

The power controller 601 may comprise suitable logic, circuitry, and/or code that may enable generation of a power supply and bias control reference voltage in proportion to the envelope of a signal. In this regard, the power controller 601 may input I/Q signals communicated from the DSP 602. An envelope detector may then analyze the incoming I/Q signals to determine an average amplitude of the signal. The amplitude of the signal may correspond to the following formula:

$$S = \sqrt{I^2 + Q^2}$$

where S is the amplitude of the signal and I and Q are the respective in-phase and quadrature components of the signal. The power controller 601 may collect a series of samples that may be used to determine an average signal amplitude or envelope of the signal. In this regard, the power controller 601 may comprise a memory for storing the samples. The power controller 601 may then output a power supply reference voltage, bias controller reference voltage, and pre-driver power supply reference voltage. These reference voltages may be proportional to the average envelope computed. For example, if the envelope detector detects a signal with a large envelope, the reference voltages may be increased. Conversely, if a small envelope is detected the reference voltages may be decreased. The reference voltages may be output to the power supply 603, bias controller 607 and pre-driver power supply 608.

The power controller 601 may also adjust the various reference voltages in response to a control signal from the control block 304 (FIG. 3). In this regard, the control signal from the control block 304 may enable the power controller 601 to converge to the correct voltage settings for the various reference voltages more quickly. For example, the power controller 601 may initially be configured to handle signals corresponding to, for example, WCDMA. The control block 304 may then indicate that the next time slot is to be utilized for Bluetooth. If, for example, the envelope of a Bluetooth signal is always smaller than the envelope of a WCDMA signal, the power controller may quickly adjust the reference voltages down to voltages that correspond to the maximum envelope of a Bluetooth signal.

The power supply 603, bias controller 607 and pre-driver power supply 608 may comprise suitable logic, circuitry, and/or code that may enable generation of an output voltage. In this regard, the input voltage to the power supply 603, bias controller 607 and pre-driver power supply 608 may be larger or smaller than the respective outputs. The power supply 603, bias controller 607 and pre-driver power supply 608 may accomplish the conversion by utilizing a switch mode regulator. The regulator may regulate the output voltage by converting the input voltage into a pulse and then varying the duty cycle of that pulse in response to a reference input. For example, given an input voltage of 10 volts, an output voltage of 5 volts may be obtained by generating a pulse with a 50% duty cycle. The pulse may then be filtered to obtain a DC voltage.

The voltage output from the power supply 603, bias controller 607 and pre-driver power supply 608 may be controlled by the power controller 601. In this manner, the power supply 603, bias controller 607 and pre-driver power supply 608 may convert a higher voltage to a lower voltage while minimizing the power dissipation associated with such a conversion. The output of the power supply 603 may be utilized to power the PA 604. The output of the bias controller 607 may be utilized to adjust the DC bias of the PA 604 and thus control the gain of the PA 604. The output of the pre-driver power supply 608 may be utilized to power the pre-driver 600.

The calibrator 605 may comprise suitable logic, circuitry, and/or code that may enable minimizing the amount of intermodulation distortion (IMD) produced at the output of a PA. In this regard, it may be necessary to match the delay path of the power controller 601 to that of the pre-driver 600 to ensure that the PA 604 may have enough headroom to handle a signal of a given envelope. For example, the PA 604 may not need as much headroom to handle signals with small envelopes. Thus, the supply voltage for the PA 604 may be reduced. However, if the supply voltage for the PA 604, for example, is not increased before a signal with a higher envelope enters the PA 604, the PA 604 may saturate. Therefore, the amount of delay in the pre-driver 600 and the power controller 601 must be matched so that the PA 604 may have enough headroom for a pending signal before the signal arrives at the PA 604.

The calibrator 605 may match the delay of the power controller 601 and pre-driver 600 by measuring the amount of IMD at the output of the PA 604. This may be accomplished by generating sinusoidal test signals in the DSP 602, converting those signals into the I/Q domain and then passing the signals through the circuitry shown in FIG. 6. For example, the DSP 602 may output a first test signal with a small envelope and then output a second signal with a larger envelope. When the delay, for example, is not matched, IMD may be produced at the output of the PA 604. The calibrator 605 may use this information to adjust the amount of delay produced by the delay buffer 606 so as to reduce or eliminate IMD at the output of the PA 604.

It may only be necessary to calibrate the system once. Therefore, after calibration the proper amount of delay may be stored in a non-volatile memory 611 and re-read whenever the system may be re-enabled.

In operation an I/Q signal may be communicated to both the delay buffer 606 and the power controller 601. The power controller 601 may store a series of I/Q samples so as to determine an average envelope. The power controller 601 may then determine that little or no gain in the PA 604 may be necessary. In this case, the bias voltage produced by the bias controller 607 may be reduced. This may allow for a reduced power supply voltage for the PA 604 as well. For example, referring to FIG. 5B, for lower gains, the active portion 509 may be moved to a lower point on the transconductance curve 508 by decreasing the bias voltage. As a result, the supply voltage for the PA 604 may be reduced as well. If higher gain is required, the active portion may be moved to a higher point on the transconductance curve 508 by increasing the bias voltage. To prevent saturation, the power supply voltage for the PA 604 may have to be increased. In this manner the power dissipation in the PA 604 may be minimized by supplying the minimum supply voltage necessary to avoid PA 604 saturation.

In addition to lowering the power supply voltage for the PA 604, the power controller 601 may also lower the output of the pre-driver power supply 608 when the envelope of the signal is, for example, small. This may be possible because the headroom requirements of the driver 609 and the mixers 610 may be lower for lower signal envelopes. Reducing the power supply to the driver 609 and the mixers 610 may further reduce the overall power consumption of the system.

In order to prevent IMD at the output of the PA 604, the I/Q signals entering the pre-driver 600 may have to be delayed by a predetermined number of samples via the delay buffer 606. This may be necessary so that the power controller 601 may adjust the supply and bias voltages of the PA 604 before the modulated I/Q signals arrive at the input of the PA 604. For example, if the delay is not set properly, the power supply voltage may be too low, in which case the PA may saturate. If the power supply voltage is too high, optimal power efficiency may not be achieved. Therefore, delaying the I/Q data entering the pre-driver 600 by the right number of samples may prevent the PA 604 from saturating and at the same time may minimize the amount of power dissipated by the PA 604.

The optimal delay for the delay buffer 606 may be determined by the calibrator 605. The calibrator 605 may accomplish this by measuring the IMD produced by the test signals and adjusting the amount of delay produced by the delay buffer 606 so as to minimize the amount of IMD.

Figure 7:
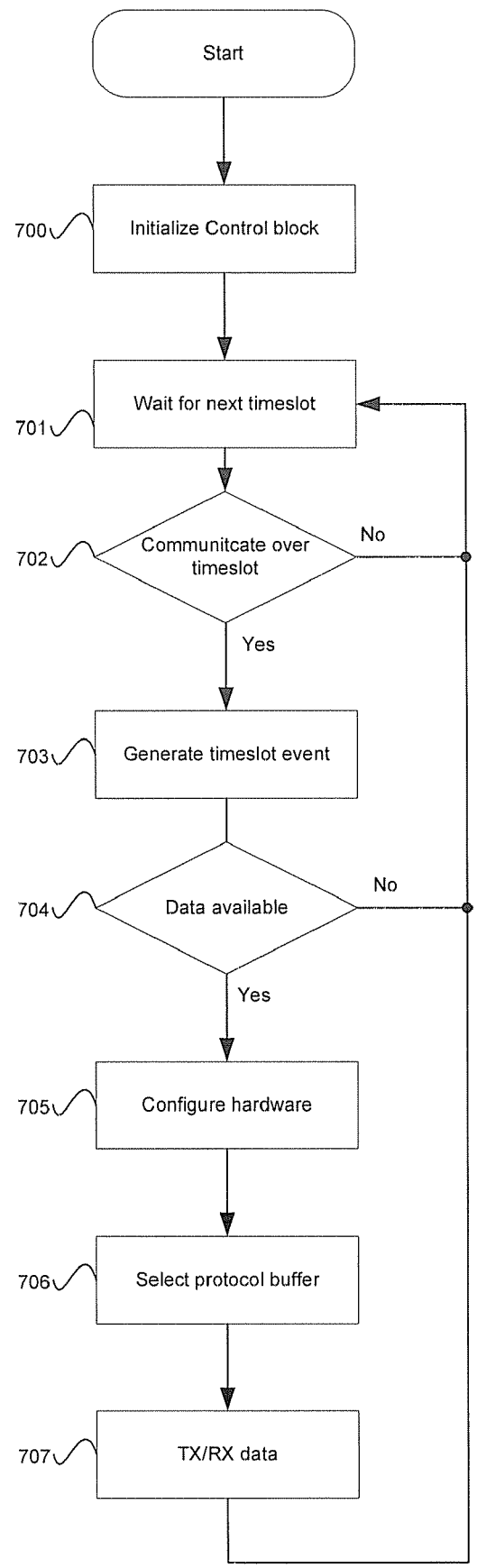
FIG. 7 is a block diagram illustrating an exemplary flow diagram of a system for sharing components in a time division multiplex wireless system, in accordance with an embodiment of the invention.

FIG. 7 is a block diagram illustrating an exemplary flow diagram of a system for sharing components in a time division multiplex wireless system, in accordance with an embodiment of the invention. Referring to FIG. 7, in step 700 the DSP 306 (FIG. 3) may initialize the control block 304 (FIG. 3) in the SDR 305 (FIG. 3). This may involve configuring a timer 400 (FIG. 4) for generating timeslot events. In this regard, the DSP 306 may, for example, configure the timer 400 so that the timer 400 generates a specific number of timeslot events over a given period of time. For example, the DSP 306 may configure the timer 400 so that it generates 8 timeslot events evenly distributed over, for example, 4.16 milliseconds. The DSP 306 may also configure the control block 304 so that the control block 304 may control the various hardware components within the SDR 305. For example, the DSP 306 may configure the control block 304 so that a first timeslot may be used for WCDMA RX 201 (FIG. 2) and a second timeslot may be used for BT TX 202 (FIG. 2). For example, the control block 304 may comprise a lookup table 401 (FIG. 4) of configuration settings. Each entry in the lookup table 401 may contain various hardware configuration settings that may correspond to a particular timeslot within a TDMA frame, such as a WCDMA frame.

At step 701, the DSP 306 may wait for the next timeslot. At step 702, the control block 304 may send a timeslot event for a particular timeslot if, for example, that timeslot may have been enabled for communication. If the communication over the current timeslot has been enabled, the control block 304 may generate a timeslot event to the DSP 306 at step 703. Otherwise, step 701 may be repeated. At step 704, the DSP 306 may check if there may be any data to communicate. For example, in the case of data transmission, the DSP 306 may poll various buffers 308 (FIG. 3) corresponding to various communication protocols to determine whether data needs to be communicated. In the case of data reception, the DSP 306 may check for I and Q data from the RX processing system 300 of the SDR 305. If no communication is necessary, then step 701 may be repeated.

At step 705, the control block 304 may configure various hardware components to enable communication for a particular protocol. For example, the current timeslot may have previously been configured for Bluetooth TX 202. In this case, the control block 304 may configure, for example, various filters within the RX processing system 300 (FIG. 3) and the TX processing system 301 (FIG. 3), the PLL 302, the local oscillator 303 and the power controller 601 (FIG. 6) within the TX processing system 301 the with values stored in a lookup table corresponding to the current timeslot. At step 706, the DSP 306 may communicate I and Q data to the TX processing system 301 of the SDR 305 in the case of data transmission, or the RX processing system 300 of the SDR 305 may communicate I and Q data to the DSP 306 in the case of data reception. After this, step 700 may be repeated.

Figure 8:
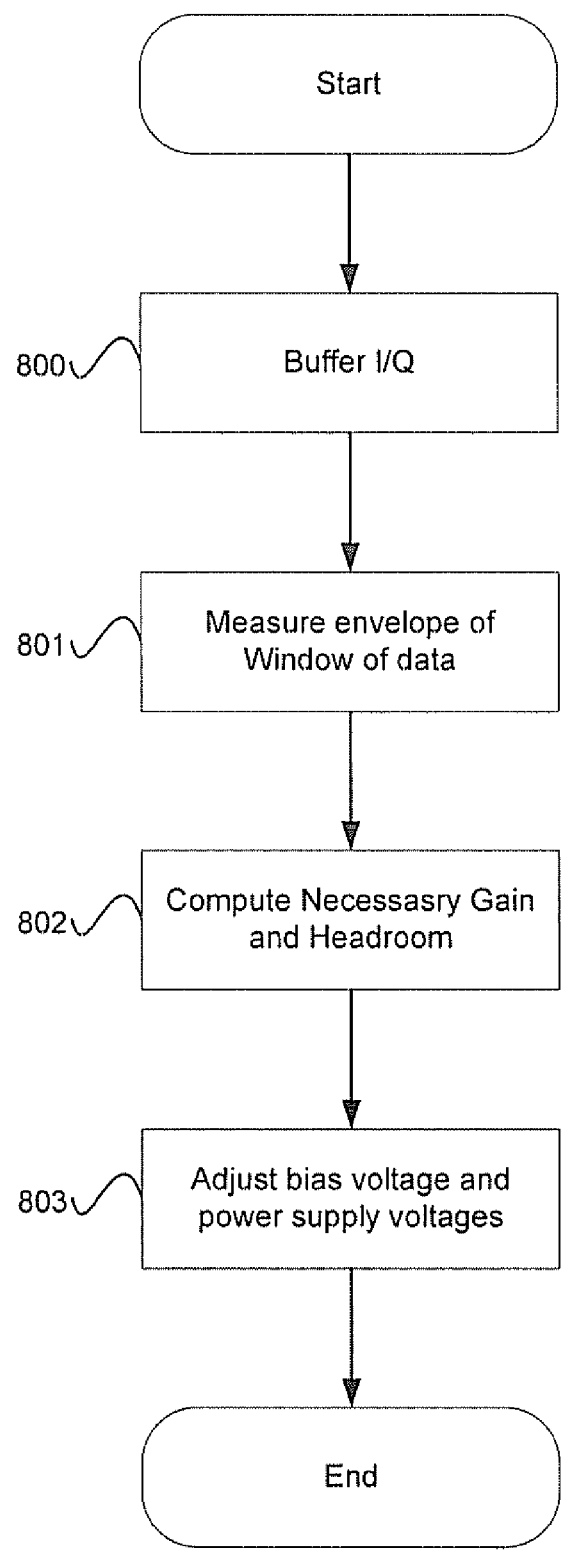
FIG. 8 is a block diagram of an exemplary flow diagram for adjusting several power supplies and a bias voltage, in accordance with an embodiment of the invention.

FIG. 8 is a block diagram of an exemplary flow diagram for adjusting several power supplies and a bias voltage, in accordance with an embodiment of the invention. At step 800 the power controller 601 may buffer a series of I/Q samples from the DSP 602. This may allow the envelope detector within the power controller 601 to determine the envelope of the signal at step 801.

At step 802, the power controller 601 may compute the gain and power supply requirements needed by the PA 604 as well as the power supply requirements for the driver 609 and mixers 610 in the pre-driver 600. For example, for smaller envelopes, less gain and a lower supply voltage may be required. For larger envelopes, more gain and a higher supply voltage may be required. The power controller 601 may take into consideration the type of signal being transmitted. The information may be communicated to the power controller 601 by the control block 304 (FIG. 3). For example, the power controller 601 may initially be configured to handle signals corresponding to, for example, WCDMA. The control block 304 may then indicate that the next time slot is to be utilized for Bluetooth. If, for example, the envelope of a Bluetooth signal is always smaller than the envelope of a WCDMA signal, the power controller may quickly adjust the reference voltages down to voltages that correspond to the maximum envelope of a Bluetooth signal. This may in turn lead to power savings in the system.

At step 803, the power controller 601 may generate the appropriate reference voltages for the power supply 603, bias controller 607, and pre-driver power supply 608. The power supply 603, bias controller 607, and pre-driver power supply 608 may then provide the supply and bias voltages necessary for proper amplification of the signal.

Figure 9:
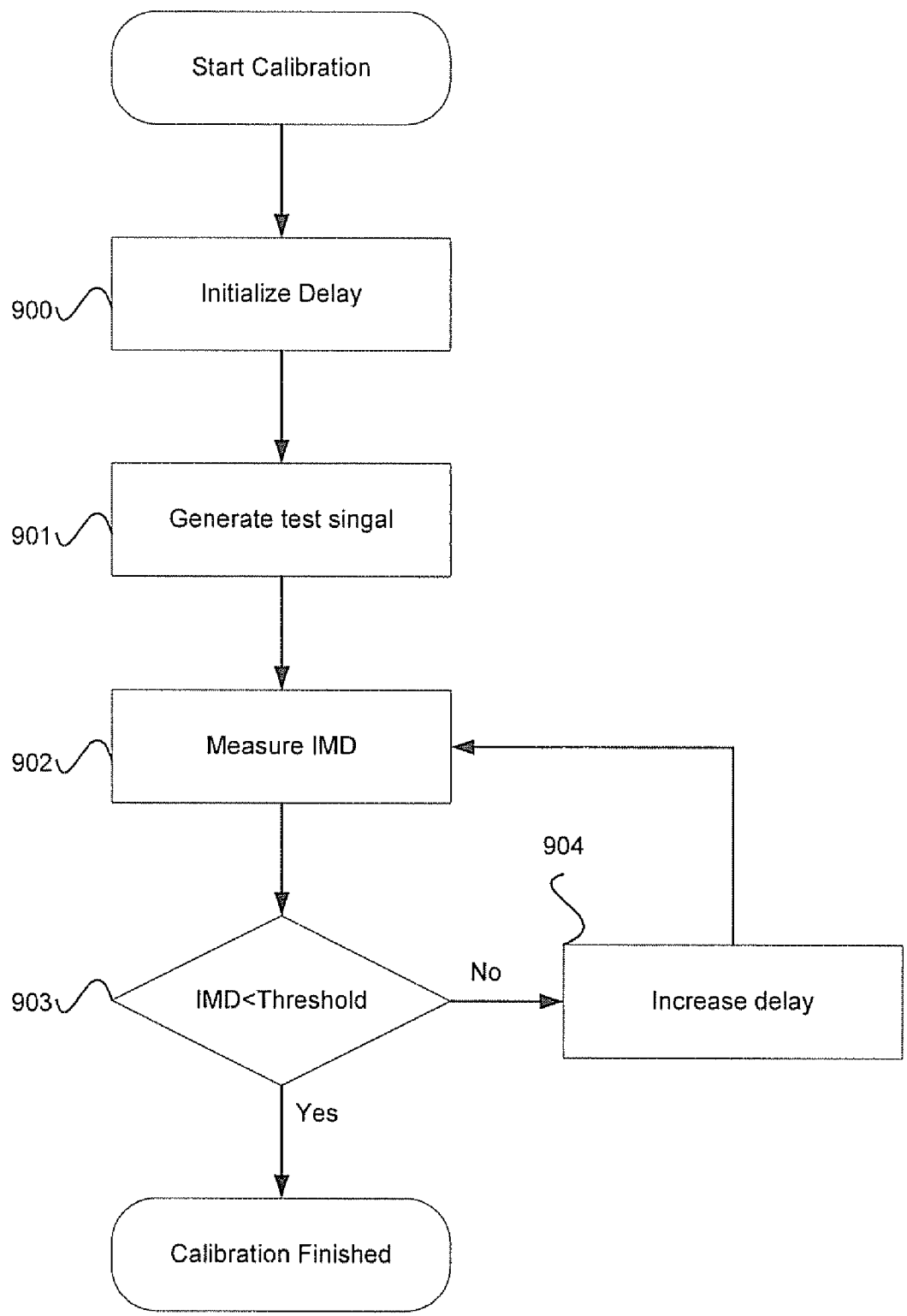
FIG. 9 is a block diagram of an exemplary flow diagram for calibrating a delay buffer, in accordance with an embodiment of the invention.

FIG. 9 is a block diagram of an exemplary flow diagram for calibrating a delay buffer, in accordance with an embodiment of the invention. In step 900, the amount of delay in the delay buffer 606 may be set to a value well below an estimated optimal value. At step 901, a sequence of sinusoidal test signals may be generated by the DSP. For example, the DSP may output a first test signal with a small envelope and then output a second signal with a larger envelope. When the delay, for example, is not matched, IMD may be produced at the output of the PA 604. The IMD may be measured by the calibrator at step 902.

At step 903, the amount of IMD may be compared to a threshold. The threshold may correspond to a level of IMD that may be acceptable. If the amount IMD is greater than the threshold, the amount of delay in the delay buffer 606 may be increased at step 904. After this step, the IMD may be measured again and compared with the threshold. Once the amount of IMD is, for example, below the threshold, the process may stop and the optimal delay found may be stored to a non-volatile memory 611 for later retrieval.

Another embodiment of the invention may provide a method for performing the steps as described herein for minimizing power consumption in a communication system. For example, the power supply 602 for the PA 603 may be configured to enable communication via a first communication protocol during a first timeslot of a TDM frame, reconfigured to enabled communication via a second communication protocol during a second timeslot of the TDM frame, and adjusted in proportion to the envelope of the baseband signal corresponding to the first and second communication protocols that is input into the PA 603, where the communication protocols may correspond to an RF protocol, such as WCDMA, HSDPA, HSUDPA, GSM, GPRS, EDGE, WiMAX, OFDM, UWB, ZigBee, or Bluetooth, and may be delayed by a determined number of samples in the delay buffer 605 before being communicated to the PA 603. The bias voltage 606, used to control the gain of the PA 602 may also be adjusted to enable communication via the communication protocols described above and adjusted in proportion to the envelope of the baseband signal as well. The number of samples and the corresponding amount of delay inserted by the delay buffer 605 may be calculated by minimizing the amount of intermodulation distortion at the output of the PA 603. The envelope may be measured by evaluating a plurality of I and Q samples of the signal. The power supply 602 for the PA 603 and the bias controller 606 may be switching regulators.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals in a communication system, the method comprising:
configuring a supply voltage of an amplifier to enable communication via a first communication protocol during a first timeslot in a time division multiplexing (TDM) frame;
reconfiguring said supply voltage of said amplifier to enable communication via a second communication protocol during at least a second timeslot in said TDM frame; and
adjusting said supply voltage of said amplifier in proportion to an envelope of a baseband signal conforming to one of said first and second communication protocols, wherein said first communication protocol is different than said second communication protocol.

2. The method according to claim 1 comprising:
configuring a bias voltage of said amplifier to enable communication via a first communication protocol during a first timeslot in a TDM frame; and
reconfiguring said bias voltage of said amplifier to enable communication via a second communication protocol during at least a second timeslot in said TDM frame.

3. The method according to claim 2 comprising, adjusting said bias voltage of said amplifier in proportion to said envelope.

4. The method according to claim 1 comprising, delaying said baseband signal by a number of samples.

5. The method according to claim 4 comprising, calculating said number of samples by minimizing an amount of intermodulation distortion at an output of said amplifier.

6. The method according to claim 1 comprising, generating said supply voltage via a switching regulator.

7. The method according to claim 2 comprising, generating said bias voltage via a switching regulator.

8. The method according to claim 1, wherein said amplifier is a linear amplifier.

9. The method according to claim 1, wherein said first communication protocol conforms to one or more of a WCDMA protocol, an HSDPA protocol, an HSUDPA protocol, a GSM protocol, a GPRS protocol, an EDGE protocol, a WiMAX protocol, an OFDM protocol, a UWB protocol, a ZigBee protocol, and/or a Bluetooth Protocol.

10. The method according to claim 1, wherein said second communication protocol conforms to one or more of a WCDMA protocol, an HSDPA protocol, an HSUDPA protocol, a GSM protocol, a GPRS protocol, an EDGE protocol, a WiMAX protocol, an OFDM protocol, a UWB protocol, a ZigBee protocol, and/or a Bluetooth Protocol.

11. A non-transitory machine-readable storage having stored thereon, a computer program having at least one code section for processing signals in a communication system, the at least one code section being executable by a machine for causing the machine to perform steps comprising:
configuring a supply voltage of an amplifier to enable communication via a first communication protocol during a first timeslot in a time division multiplexing (TDM) frame;
reconfiguring said supply voltage of said amplifier to enable communication via a second communication protocol during at least a second timeslot in said TDM frame; and
adjusting said supply voltage of said amplifier in proportion to an envelope of a baseband signal conforming to one of said first and second communication protocols, wherein said first communication protocol is different than said second communication protocol.

12. The machine-readable storage according to claim 11, wherein said at least one code section comprises:
code that enables configuring a bias voltage of said amplifier to enable communication via a first communication protocol during a first timeslot in a TDM frame; and
code that enables reconfiguring said bias voltage of said amplifier to enable communication via a second communication protocol during at least a second timeslot in said TDM frame.

13. The machine-readable storage according to claim 12, wherein said at least one code section comprises code that enables adjusting said bias voltage of said amplifier in proportion to said envelope.

14. The machine-readable storage according to claim 11, wherein said at least one code section comprises code that enables delaying said baseband signal by a number of samples.

15. The machine-readable storage according to claim 14, wherein said at least one code section comprises code that enables calculating said number of samples by minimizing an amount of intermodulation distortion at an output of said amplifier.

16. The machine-readable storage according to claim 11, wherein said at least one code section comprises code that enables generating said supply voltage via a switching regulator.

17. The machine-readable storage according to claim 12, wherein said at least one code section comprises code that enables generating said bias voltage via a switching regulator.

18. The machine-readable storage according to claim 11, wherein said amplifier is a linear amplifier.

19. The machine-readable storage according to claim 11, wherein said first communication protocol conforms to one or more of a WCDMA protocol, an HSDPA protocol, an HSUDPA protocol, a GSM protocol, a GPRS protocol, an EDGE protocol, a WiMAX protocol, an OFDM protocol, a UWB protocol, a ZigBee protocol, and/or a Bluetooth Protocol.

20. The machine-readable storage according to claim 11, wherein said second communication protocol conforms to one or more of a WCDMA protocol, an HSDPA protocol, an HSUDPA protocol, a GSM protocol, a GPRS protocol, an EDGE protocol, a WiMAX protocol, an OFDM protocol, a UWB protocol, a ZigBee protocol, and/or a Bluetooth Protocol.

21. A system for processing signals in a communication system, the system comprising:
one or more circuits that enables configuring a supply voltage of an amplifier to enable communication via a first communication protocol during a first timeslot in a time division multiplexing (TDM) frame;
said one or more circuits enables reconfiguring said supply voltage of said amplifier to enable communication via a second communication protocol during at least a second timeslot in said TDM frame; and
said one or more circuits enables adjusting said supply voltage of said amplifier in proportion to an envelope of a baseband signal conforming to one of said first and second communication protocols, wherein said first communication protocol is different than said second communication protocol.

22. The system according to claim 21, wherein said one or more circuits enables:
configuring a bias voltage of said amplifier to enable communication via a first communication protocol during a first timeslot in a TDM frame; and
reconfiguring said bias voltage of said amplifier to enable communication via a second communication protocol during at least a second timeslot in said TDM frame.

23. The system according to claim 22, wherein said one or more circuits enables adjusting said bias voltage of said amplifier in proportion to said envelope.

24. The system according to claim 21, wherein said one or more circuits enables delaying said baseband signal by a number of samples.

25. The system according to claim 24, wherein said one or more circuits enables calculating said number of samples by minimizing an amount of intermodulation distortion at an output of said amplifier.

26. The system according to claim 21, wherein said one or more circuits enables generating said supply voltage via a switching regulator.

27. The system according to claim 22, wherein said one or more circuits enables generating said bias voltage via a switching regulator.

28. The system according to claim 21, wherein said amplifier is a linear amplifier.

29. The system according to claim 21, wherein said first communication protocol conforms to one or more of a WCDMA protocol, an HSDPA protocol, an HSUDPA protocol, a GSM protocol, a GPRS protocol, an EDGE protocol, a WiMAX protocol, an OFDM protocol, a UWB protocol, a ZigBee protocol, and/or a Bluetooth Protocol.

30. The system according to claim 21, wherein said second communication protocol conforms to one or more of a WCDMA protocol, an HSDPA protocol, an HSUDPA protocol, a GSM protocol, a GPRS protocol, an EDGE protocol, a WiMAX protocol, an OFDM protocol, a UWB protocol, a ZigBee protocol, and/or a Bluetooth Protocol.

* * * * *